(12) United States Patent
Adachi

(10) Patent No.: US 7,809,520 B2
(45) Date of Patent: Oct. 5, 2010

(54) TEST EQUIPMENT, METHOD FOR LOADING TEST PLAN AND PROGRAM PRODUCT

(75) Inventor: Toshiaki Adachi, Ota (JP)

(73) Assignee: Advantest Corporation, Tokyo (JP)

( * ) Notice: Subject to any disclaimer, the term of this patent is extended or adjusted under 35 U.S.C. 154(b) by 22 days.

(21) Appl. No.: 11/935,262

(22) Filed: Nov. 5, 2007

(65) Prior Publication Data

US 2009/0119054 A1 May 7, 2009

(51) Int. Cl.
*G01R 31/00* (2006.01)
*G01R 31/14* (2006.01)

(52) U.S. Cl. .................................................... 702/119

(58) Field of Classification Search ......... 702/117–119, 702/123; 324/500, 537, 765; 714/718, 724
See application file for complete search history.

(56) References Cited

U.S. PATENT DOCUMENTS

| | | | | |
|---|---|---|---|---|
| 5,566,088 A | * | 10/1996 | Herscher et al. | ............ 702/123 |
| 5,648,975 A | * | 7/1997 | Deguchi | ..................... 714/738 |
| 7,437,261 B2 | * | 10/2008 | Pramanick et al. | .......... 702/117 |
| 7,640,132 B2 | * | 12/2009 | Katagiri et al. | ............. 702/123 |
| 7,689,876 B2 | * | 3/2010 | Chung et al. | ................ 714/704 |
| 2005/0039079 A1 | | 2/2005 | Higashi et al. | |
| 2005/0154551 A1 | * | 7/2005 | Pramanick et al. | .......... 702/119 |
| 2005/0262412 A1 | * | 11/2005 | Mukai et al. | ................ 714/742 |
| 2008/0235550 A1 | * | 9/2008 | Yamada et al. | .............. 714/738 |

* cited by examiner

*Primary Examiner*—Michael P Nghiem
(74) *Attorney, Agent, or Firm*—Osha • Liang LLP

(57) ABSTRACT

Test equipment includes a memory to which a test plan that includes a plurality of sub-test plans is loaded and a system controller that, when the test equipment actually examines a device-under-test (DUT), loads the test plan to the memory by the unit of the sub-test plan and supplies a test signal to the DUT by interpreting the loaded test plan.

14 Claims, 10 Drawing Sheets

OPERATION = PATTERN DATA * TIMING DATA (LIMITED BY TimeSet) * NUMBER OF WAVES

```
A    1
B    1
C    1
D    1
E    2 → 1
F    1 → 0            ⇐ unload
G    1 → 0 → 1
H            → 1   ⎫
I            → 1   ⎬ reload
```

TEST EQUIPMENT, METHOD FOR LOADING TEST PLAN AND PROGRAM PRODUCT

BACKGROUND OF THE INVENTION

1. Field of the Invention

The present invention relates to the field of automated test equipment (ATE). In particular, the present invention relates to a technique of loading of a test plan in the ATE for semiconductor testing.

2. Description of the Related Art

The most part of cost in manufacturing semiconductor is for development and maintenance of a test program for testing an integrated circuit for practicability and functionality. Many hours of operations on actual tester hardware have been needed for the purpose of performing the development and maintenance. That is, a conventional semiconductor tester has little or no capability to simulate a test program. Under such restriction, an engineer is forced to debug his/her test program in the actual tester hardware.

Recently, an emulator for test equipment has been provided. Accordingly, functionality of a test program can be verified without requiring the use of any high-priced test equipment. For example, U.S. Patent Application Publication No. US 2005/0039079 A1, assigned to the assignee of the present invention, discloses an emulator for simulating a module type test system by using a test program, a vender module and a corresponding device-under-test (DUT).

Recently, many functions have been integrated into one chip, significantly advancing the speed, size and function of a device. That causes a big problem that testing of the device needs to catch up with such trends of advancement and complication in functionality and also needs to improve capability of analyzing a device to shorten a turn around time (TAT).

Conventional test plan program is monolithic, which means that a single test plan program is defined for a device. Accordingly, as more and more functions are incorporated into such devices, the size of the test plan program is increasing. That not only adds to a load of development of the test plan program but also increase a time required to load the test plan program to test equipment. Particularly, in an actual occasion of operating test equipment, the entire of the monolithic test plan of a current model needs to be deleted (unloaded) from the test equipment and the entire of a new test plan needs to be reloaded to the test equipment each time a DUT is changed to another DUT with a different model. When various models of devices are manufactured by a small number for each model or if different models of devices need to be tested in a day, time will be consumed just for loading the test plan program.

Recent semiconductor devices are typically configured with a great number of blocks combined. When a DUT to be tested by the test equipment is changed to another DUT with a different model, the first DUT and the second DUT may have most of the great number of blocks in common with only some blocks being different from each other. If the test equipment is adapted to require only the test programs, pattern files and the like relating to the different blocks to be loaded and unloaded effectively, the time for loading can be shorter, which leads to a shorter TAT.

The present invention is adapted in view of such circumstances. Several aspects according to the present invention is to modularize a test plan for test equipment by dividing the test plan into a plurality of sub-test plans, exchange (unload and reload) only different test plans by detecting a difference between the test plans before and after the changing of the DUTs when the DUTs with different models are changed, and exchange (unload and reload) different pattern programs which differ before and after the changing of the DUTs by managing the pattern programs which are used for the sub-test plans.

SUMMARY OF THE INVENTION

In order to solve the abovementioned problems, test equipment according to the present invention includes a memory to which a test plan consisting of a plurality of sub-test plans is loaded and a system controller that loads the test plan to the memory by the unit of the sub-test plan and supplies a test signal to a device-under-test (DUT) by interpreting the loaded test plan. Preferably, the system controller unloads the test plan from the memory by the unit of the sub-test plan.

Also preferably, the system controller detects a difference of test plans before and after the changing of the DUTs with different models when the models of the DUTs are changed, and exchanges (loads and/or unloads) the sub-test plans based on the detected difference. Here, the system controller preferably detects the difference based on a file that contains a plurality of sub-test plans included in the test plan.

More preferably, the system controller detects a difference between pattern files used for test plans before and after changing of the DUTs with different models when the models of the DUTs are changed, and exchanges (loads and/or unloads) the pattern files based on the detected difference. Here, the system controller preferably manages the pattern files used for the test plan by using a reference counter.

It is also preferable to define one of a plurality of sub-test plans as a main test plan to enable the other sub-test plans to reference the data defined in the main test plan.

It is further preferable to define one or more of the plurality of sub-test plans as a final test plan to enable the final test plan to reference the data defined in the other sub-test plans. Here, the system controller preferably unloads the final test plan when it changes the models of the DUTs.

A method for loading a test plan in test equipment that supplies a test signal to a device-under-test (DUT) according to the present invention includes: a step of defining a test plan by dividing the test plan into a plurality of sub-test plans; a step for a system controller to load the test plan by the unit of the sub-system plan; and a step for the system controller to supply the test signal to the DUT by interpreting the loaded test plan.

A computer program product according to the present invention causes a computer that forms test equipment to execute each of the processing steps of the method for loading the test plan according to the present invention. The computer program of the present invention can be installed or loaded to a computer through various recording media such as an optical disk including a CD-ROM, a magnetic disk and a semiconductor memory or by downloading the program over a transmission media such as the Internet. Media for recording or transmitting a program are not limited to them. The computer program product, software and hardware described in the specification form various means for executing the features of the present invention in the embodiments.

The term 'load' used in the present invention refers to an operation of calling a main program, a pattern program and the like stored in an external storage such as a hard drive to a main memory of a computer, a memory on the test equipment or the like. The term 'unload' refers to deleting the main program, the pattern program and the like decompressed in the main memory of the computer, the memory on the test equipment or the like for releasing the region.

The term 'means' in the specification covers meaning of a function of the means implemented by a software program instead of simply limited to physical means implemented by hardware. A function of a unit of means may be implemented by two or more units of physical means or functions of two or more units of means may be implemented by a unit of physical means.

By referencing the drawings below for additional features and advantages of the present invention as well as the above-mentioned features and advantages, the detailed description of embodiments of the present invention will be more apparently understood.

BRIEF DESCRIPTION OF THE DRAWINGS

FIG. 7(A) is a diagram showing an example of a plurality of sub-test plans 131 loaded to the test equipment 100 before exchanging the products in the embodiment and FIG. 7(B) is a diagram showing an example of the plurality of sub-test plans 131 to be loaded to the test equipment 100 for exchanging the products;

DETAILED DESCRIPTION OF THE PREFERRED EMBODIMENTS

Embodiments of the present invention will be described in detail below. Like numerals are given to like elements and the redundant description will be omitted. The embodiments shown below merely provide examples for describing the present invention and do not intend to limit the present invention thereto. Various modifications and applications are possible for the present invention without departing from the spirit of the invention.

Figure 1:
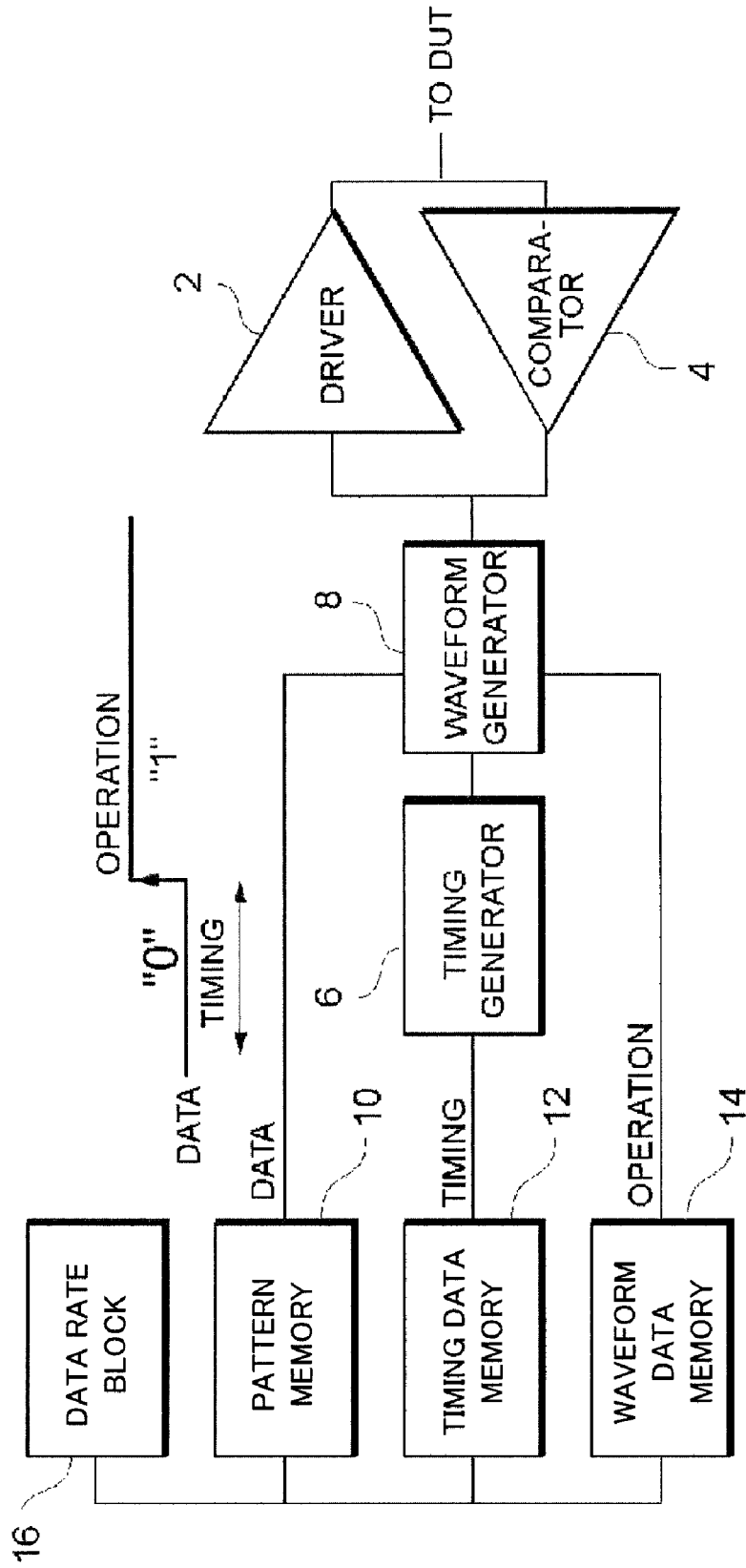
FIG. 1 is a diagram showing a generalized architecture of a conventional tester.

FIG. 1 illustrates a generalized architecture of a conventional tester showing how a signal is generated and applied to a device-under-test (DUT). Each DUT input pin is connected to a driver 2 that applies test data, while each DUT output pin is connected to a comparator 4. In most cases, tri-state driver-comparators are used so that each tester pin (channel) can act either as an input pin or as an output pin. The tester pins dedicated to a single DUT collectively form a test site that works with an associated timing generator 6, waveform generator 8, pattern memory 10, timing data memory 12, waveform memory data 14, and block 16 that define the data rate.

Figure 2:
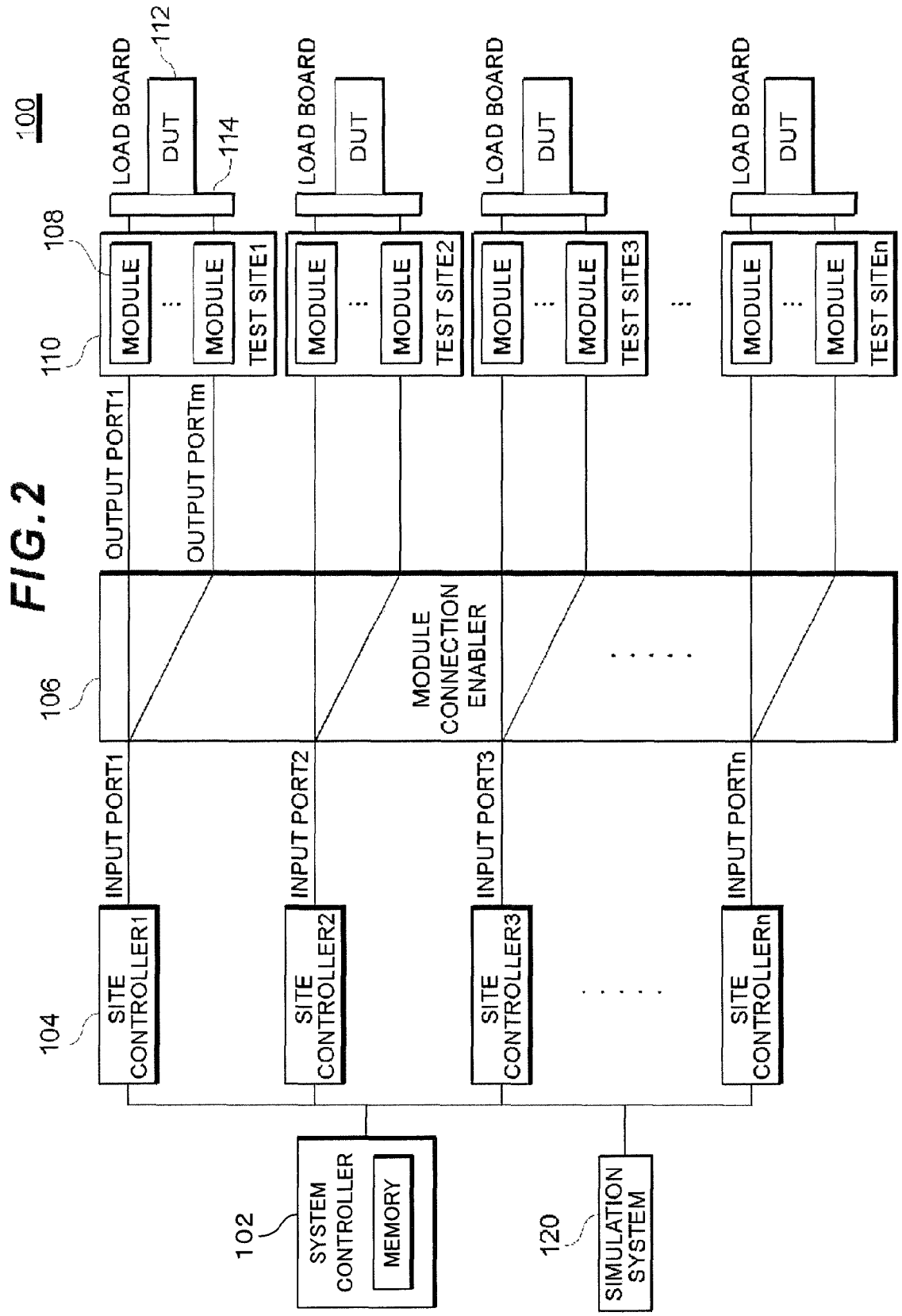
FIG. 2 shows a system architecture of test equipment 100 according to an embodiment of the present invention.

FIG. 2 shows a system architecture of the test equipment 100 according to an embodiment of the present invention. The test equipment 100 generates and supplies a test signal to a DUT 112, and determines the quality of the DUT 112 based on whether a result signal output as a result of the DUT 112 having operated according to the test signal matches an expected value or not. The test equipment 100 according to the embodiment is implemented in an open architecture. The test equipment 100 can use various modules based on the open architecture as a module 108 for supplying a test signal to the DUT 112.

In the embodiment, a system controller (SysC) 102 is coupled to multiple site controllers (SiteCs) 104. The system controller 102 may also be coupled to a network to access files. Through a module connection enabler 106, each site controller 104 is coupled to one or more test modules 108 located at a test site 110 to control them. The module connection enabler 106 allows reconfiguration of connected hardware modules 108 and also serves as a bus for data transfer (for loading pattern data, gathering response data, providing control, etc.). Possible hardware implementations include dedicated connections, switch connections, bus connections, ring connections, and star connections. The module connection enabler 106 may be implemented by a switch matrix, for example. Each test site 110 is associated with a DUT 112, which is connected to the modules of the corresponding site through a loadboard 114. In another embodiment, a single site controller may be connected to multiple DUT sites.

The system controller 102 serves as the overall system manager. It receives test data such as a test controlling program, test plan program, pattern file and the like used by the test equipment 100 in testing the DUT 112 via an external network and the like and loads the test data to the memory. It coordinates the site controller 104 activities, manages system-level parallel test strategies, and additionally provides for handler/probe controls as well as system-level data-logging and error handling support. Depending on the operational setting, the system controller 102 can be deployed on a CPU that is separate from the operation of site controllers 104. Alternatively, a common CPU may be shared by the system controller 102 and the site controllers 104. Similarly, each site controller 104 can be deployed on its own dedicated CPU (central processing unit), or as a separate process or thread within the same CPU. In some operational setting, the system controller 102 can be deployed on a CPU that is separate from the operation of a simulation system 120. Alternatively, a common CPU may be shared by the system controller 102 and the simulation system 120.

The system architecture shown in FIG. 2 can be conceptually envisioned as the distributed system with the understanding that the individual system components could also be regarded as logical components of an integrated, monolithic system, and not necessarily as physical components of a distributed system.

Figure 3:
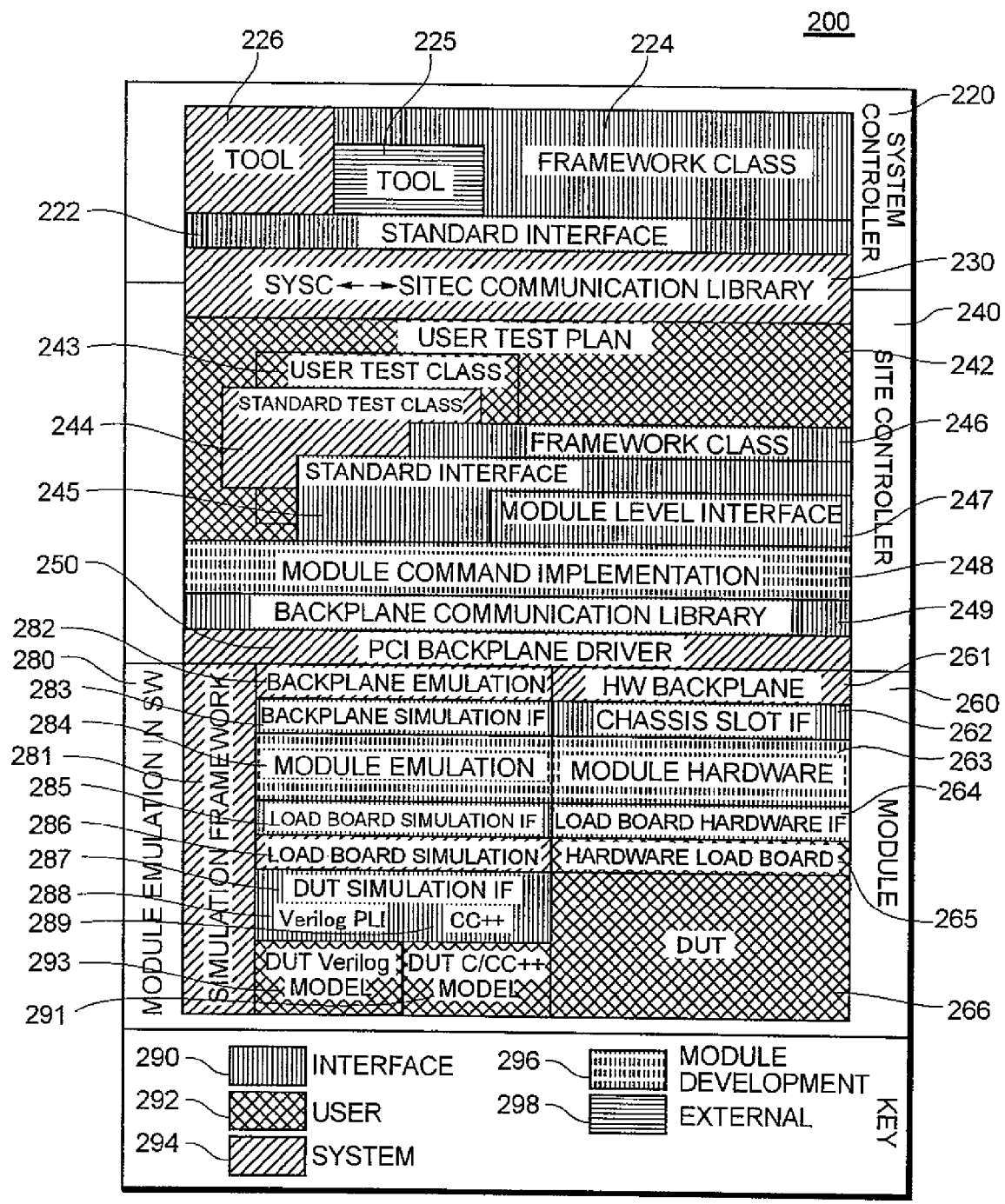
FIG. 3 is a diagram showing a software architecture 200 according to an embodiment of the present invention.

FIG. 3 illustrates a software architecture 200 according to an embodiment of the present invention. The software architecture 200 represents a distributed operating system, having elements for the system controller 220, at least one site controller 240, and at least one module 260 in correspondence to related hardware system elements 102, 104, 108. In addition to the module 260, the architecture 200 includes a corresponding element for module emulation 280 in software.

As an exemplary choice, the development environment for this platform can be based on Microsoft Windows. The use of this architecture has side benefits in program and support portability (e.g., a field service engineer could connect a laptop which runs the tester operating system to perform advanced diagnostics). However, for large amount of computer-intensive operations (such as test pattern compiles), the relevant software can be made as an independent entity capable of running independently to allow job scheduling across distributed platforms. Related software tools for batch jobs are thus capable of running on multiple platform types.

As an exemplary choice, ANSI/ISO standard C++ can be taken as the native language for the software. Of course, there are a multitude of options available (to provide a layer over the nominal C++ interfaces) that allows a third party to integrate into the system with an alternative language of its own choice.

FIG. 3 illustrates shading of components according to their organization by nominal source (or collective development as a sub-system) including the tester operating system, user components 292 (e.g., supplied by a user for test purposes), system components 294 (e.g., supplied as software infrastructure for basic connectivity and communication), module development components 296 (e.g., supplied by a module developer), and external components 298 (e.g., supplied by external sources other than module developers).

From the perspective of source-based organization, the tester operating system (TOS) interface 290 includes: System Controller standard interfaces 222, framework classes 224, Site Controller standard interfaces 245, framework classes 246, predetermined module-level interfaces, backplane communications library 249, chassis slot IF (Interface) 262, loadboard hardware IF 264, backplane simulation IF 283, loadboard simulation IF 285, DUT simulation IF 287, Verilog PLI (programming language interface) 288 for DUT's Verilog model and C/C++ language support 289 for DUT's C/C++ model.

User components 292 include: a user test plan 242, user test classes 243, hardware loadboard 265, DUT 266, a DUT Verilog model 293 and a DUT C/C++ model 291.

System components 294 include: system tools 226, communications library 230, test classes 244, a backplane driver 250, HW backplane 261, simulation framework 281, backplane emulation 282, and loadboard simulation 286.

Module-development components 296 include: module commands implementation 248, module hardware 263, and module emulation 284.

External components 298 include external tools 225.

The system controller 220 includes standard interfaces 222, framework classes 224, system tools 226, external tools 225, and a communications library 230. The System Controller software is the primary point of interaction for the user. It provides the gateway to the Site Controllers of the invention, and synchronization of the Site Controllers in a multi-site/DUT environment as described in U.S. Patent No. 60/449,622 by the same assignee. User applications and tools, whether they are graphical user interface (GUI)-based or not, run on the System Controller. The System Controller also may act as the repository for all Test Plan related information, including Test Plans, test patterns and test parameter files. The memory storing these files may be local to the system controller or offline, e.g., connected to the system controller through a network. A test parameter file contains parameterization data for a Test class in the object oriented environment of an embodiment of the invention.

Third party developers can provide tools in addition to (or as replacements for) the standard system tools 226. The standard interfaces 222 on the System Controller 220 include interfaces that the tools use to access the tester and test objects. The Tools (applications) 225, 226 allow interactive and batch control of the test and tester objects. The tools include applications for providing automation capabilities (through, for example, the use of SECS/TSEM, etc.).

The Communications library 230 residing on the system controller 220 provides the mechanism to communicate with the Site Controllers 240 in a manner that it is transparent to user applications and test programs.

The Interfaces 222 resident in memory associated with the System Controller 220 provide open interfaces to the framework objects that execute on the System Controller. Included are interfaces allowing the Site Controller-based module software to access and retrieve pattern data. Also included are interfaces that applications and tools use to access the tester and test objects, as well as scripting interfaces, which provide the ability to access and manipulate the tester and test components through a scripting engine. This allows a common mechanism for interactive, batch and remote applications to perform their functions.

The Framework classes 224 associated with the System Controller 220 provide a mechanism to interact with these above-mentioned objects, providing a reference implementation of a standard interface. For example, the site controller 240 of the invention provides a functional test object. The system controller framework classes may provide a corresponding functional test proxy as a remote system controller-based surrogate of the functional test object. The standard functional test interface is thus made available to the tools on the system controller 220. The framework classes effectively provide an operating system associated with the host system controller. They also constitute the software elements that provide the gateway to the Site Controllers, and provide synchronization of the Site Controllers in a multi-site/DUT environment. This layer thus provides an object model in an embodiment of the invention that is suitable for manipulating and accessing Site Controllers without needing to deal directly with the Communications layer.

The site controller 240 hosts a user test plan 242, user test classes 243, standard test classes 244, standard interfaces 245, site controller framework classes 246, module high level command interfaces (i.e., predetermined module-level interfaces 247), module commands implementation 248, backplane communications library 249, and a backplane driver 250. Preferably, most of the testing functionality is handled by the site controllers 104/240, allowing independent operation of the test sites 110.

Figure 4:
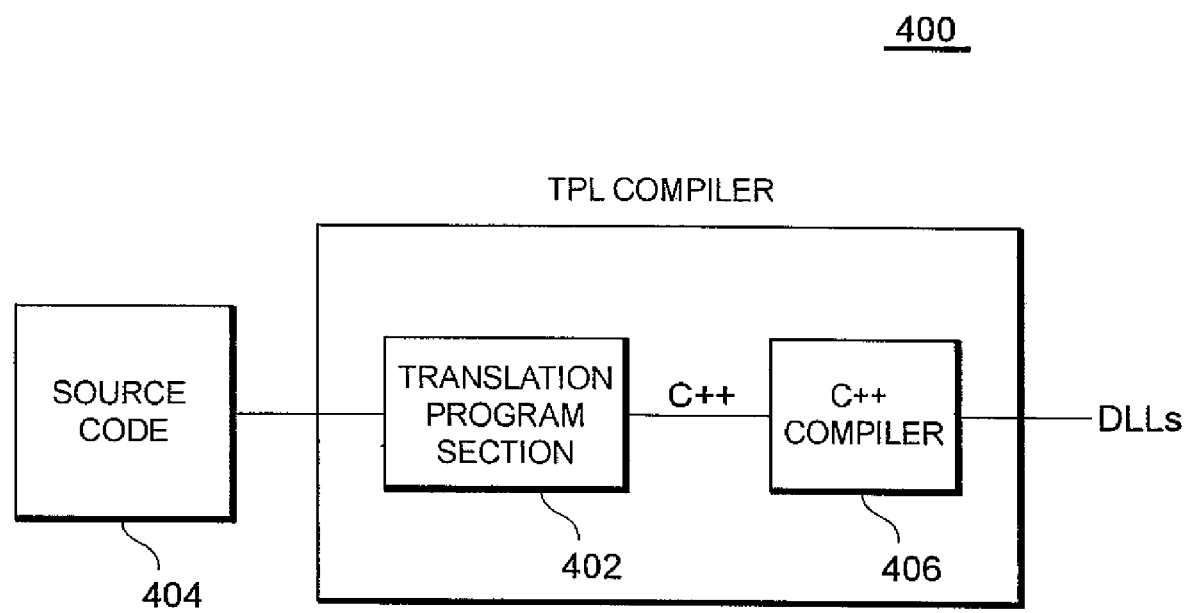
FIG. 4 is a diagram showing a test program compiler according to an embodiment of the present invention.

A test plan 242 is written by the user. The plan may be written directly in a standard computer language employing object-oriented constructs, such as C++, or described in a higher level test programming language to produce C++ code, which can then be compiled into the executable test program. For test program development, one embodiment of the invention employs assignee's inventive Test Program Language (TPL) compiler. Referring to FIG. 4, the test program compiler 400 acts in part as a code generating ignoring test including a translating program section 402 to translate a test program developer's source files 404 describing tests and associated parameters into object-oriented constructs, such as C++ code. A compiler section 406, in turn, compiles and links the code into executable files, e.g., DLLs, to create the test program that may be executed by the tester system. Also, the compiler section may be a standard C++ compiler known in the art.

The embodiment shows an example where the test plan program is loaded in the form of a dynamic link library (DLL). The test equipment 100, however, may include a translator for converting a test describing file (OTPL) into codes of C++ and a project file for directly loading the OTPL. When the OTPL is directly loaded, the system controller 102 and the site controller 104 directly interprets the OTPL. Here, neither generation of the C++ code nor compilation of the codes are not performed.

The test plan creates test objects by using the Framework Classes 246 and/or standard or user supplied Test Classes 244 associated with the site controllers, configures the hardware using the Standard Interfaces 245, and defines the test plan flow. It also provides any additional logic required during execution of the test plan. The test plan supports some basic services and provides an interface to the services of underlying objects, such as debug services (e.g., break-pointing), enabling underlying framework and standard classes to be accessed.

If the test plan is the DLL, the source code input to the test program compiler 400 includes a Test Plan description file that specifies the objects used in a test plan and their relationships to one another. This file is translated to C++ code that is executed on the Site Controller in the form of an implementation of a standard interface, which may be denoted ITestPlan. This code is packaged into a Windows dynamic link library (DLL), which may be loaded onto the Site Controller. The Test Program DLL is generated to have standard known entry points that the Site Controller software can use to generate and return the TestPlan object it contains. The Site Controller software loads the Test Program DLL into its process space and uses one of the entry points to create an instance of the Test Plan object. Once the Test Plan object has been created, the Site Controller software can then execute the test plan.

The Framework classes 246 associated with the site controllers are a set of classes and methods that implement common test-related operations. The site controller-level framework includes, for example, classes for power supply, and pin electronics sequencing, setting level and timing conditions, obtaining measurements, and controlling test flow. The framework also provides methods for runtime services and debugging. The framework objects may work through implementing the standard interfaces. For example, the implementation of the TesterPin framework class is standardized to implement a general tester pin interface that test classes may use to interact with hardware module pins.

Certain framework objects may be implemented to work with the help of the module-level interfaces 247 to communicate with the modules. The site controller framework classes can effectively act as a local operating system supporting each site controller.

In general, more than ninety percent of the program code is data for the device test, and the remaining ten percent of the code realizes the test methodology. The device test data is DUT-dependent (e.g., power supply conditions, signal voltage conditions, timing conditions, etc.). The test code consists of methods to load the specified device conditions on to ATE hardware, and also those needed to realize user-specified objectives (such as datalogging). The framework of an embodiment of the invention provides a hardware-independent test and tester object model that allows the user to perform the task of DUT test programming.

To increase the reusability of test code, such code may be made independent of any device-specific data (e.g., pin name, stimulus data, etc.), or device-test-specific data (e.g., conditions for DC units, measurement pins, number of target pins, name of pattern file, addresses of pattern programs). If code for a test is compiled with data of these types, the reusability of the test code would decrease. Therefore, according to an embodiment of the invention, any device-specific data or device-test-specific data may be made available to the external test code as inputs during code execution time.

In an embodiment of the invention, a Test Class, which is an implementation of a standard test interface, denoted here as ITest, realizes the separation of test data and code (and hence, the reusability of code) for a particular type of test. Such a test class may be regarded as a "template" for separate instances of itself, which differ from each other only by device-specific and/or device-test-specific data. Test classes are specified in the test plan file. Each Test class typically implements a specific type of device test or setup for device test. For example, an embodiment of the invention may provide a specific implementation of the ITest interface, for example, FunctionalTest, as the base class for all functional tests for DUTs. It provides the basic functionality of setting test conditions, executing patterns, and determining the status of the test when strobes fails. Other types of implementations may include AC and DC test classes, denoted here as ACParametricTests and DCParametricTests.

All test types may provide default implementations of some virtual methods (e.g., init ( ), preExec ( ) and postExec ( )). These methods become the test engineer's entry points for overriding default behavior and setting any test-specific parameters. However, custom test classes can also be used in test plans.

Figure 5:
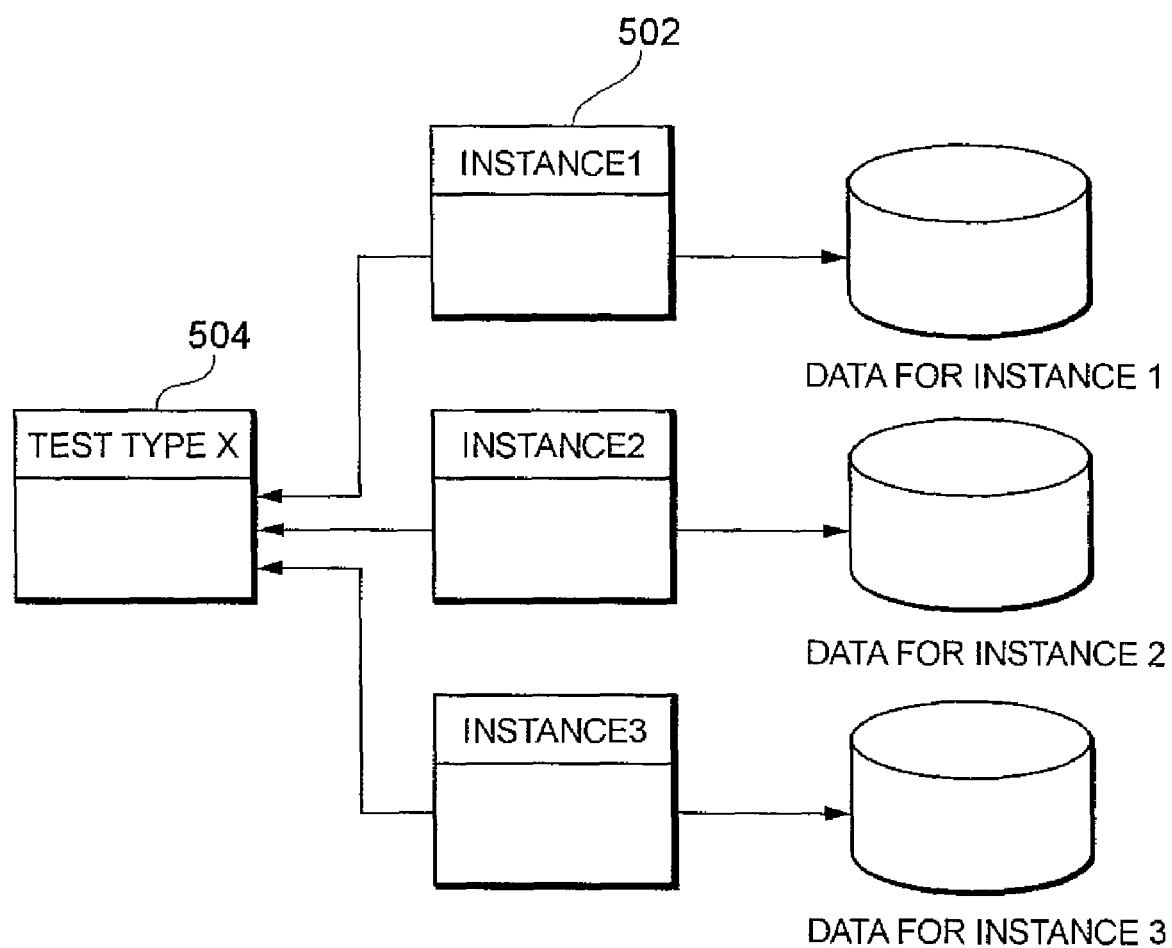
FIG. 5 is a diagram showing how various test instances can be derived from a single test class according to an embodiment of the present invention.

Test classes allow the user to configure class behavior by providing parameters that are used to specify the options for a particular instance of that test. For example, a Functional Test may take parameters PList and TestConditions to specify the Pattern List to execute, and the Level and Timing conditions for the test, respectively. Specifying different values for these parameters (through the use of different "Test" blocks in a test plan description file) allows the user to create different instances of a Functional Test. FIG. 5 illustrates how various test instances can be derived from a single test class. These classes may be programmed directly in object-oriented constructs, such as C++ code, or designed to allow a test program compiler to take the description of the tests and their parameters from a test plan file and generate corresponding C++ code, which can be compiled and linked to generate the test program. A Template Library may be employed as the general-purpose library of generic algorithms and data structures. This library may be visible to a user of the tester, so that the user may, for example, modify the implementation of a test class to create a user-defined test class.

As to user-developed test classes, an embodiment of the system supports integration of such test classes into the framework in that all test classes derive from a single test interface, e.g., ITest, so that the framework can manipulate them in the same way as the standard set of system test classes. Users are free to incorporate additional functionality into their test classes, with the understanding that they have to use custom code in their test programs to take advantage of these additional facilities.

Each test site 110 is dedicated to testing one or more DUTs 112, and functions through a configurable collection of test modules 108. Each test module 108 is an entity that performs a particular test task. For example, a test module 108 could be a DUT power supply, a pin card, an analog card, etc. This modular approach provides a high degree of flexibility and configurability.

The Module Commands Implementation classes 248 may be provided by module hardware vendors, and implement either the module-level interfaces for hardware modules, or provide module-specific implementations of standard interfaces, depending on the commands implementation method chosen by a vendor. The external interfaces of these classes are defined by pre-determined module-level interface requirements, and backplane communications library requirements. This layer also provides for extension of the standard set of test commands, allowing the addition of methods (functions) and data elements.

The Backplane Communications Library 249 provides the interface for standard communications across the backplane, thereby providing the functions necessary to communicate with the modules connected to the test site. This allows vendor-specific module software to use a Backplane Driver 250 to communicate with the corresponding hardware modules. The backplane communications protocol may use a packet based format.

Tester Pin objects represent physical tester channels and derive from a tester pin interface, denoted here as ITesterPin. The software development kit (SDK) of an embodiment of the invention provides a default implementation of ITesterPin, which may be called TesterPin, which is implemented in the form of a predetermined module-level interface, IChannel. Vendors are free to make use of TesterPin if they can implement their module's functionality in the form of IChannel; otherwise, they must provide an implementation of ITesterPin to work with their module.

The standard module interface, denoted here as IModule, provided by the tester system of the invention generically represents a vendor's hardware module. Different vendors may provide different modules. A vendor may provide different modules. Vendor-supplied module-specific software for the system may be provided in the form of executable files such as dynamic link libraries (DLLs). Software for each module-type from a vendor may be encapsulated in a single DLL. Each such software module is responsible for providing vendor-specific implementations for the module interface commands, which comprise the API for module software development.

There are two aspects of the module interface commands: first, they serve as the interface for users to communicate (indirectly) with a particular hardware module in the system, and second, they provide the interfaces that third-party developers can take advantage of to integrate their own modules into the site controller level framework. Thus, the module interface commands provided by the framework are divided into two types:

The first, and most obvious, are those "commands" exposed to the user through the framework interfaces. Thus, a tester pin interface (ITesterPin) provides methods to get and set level and timing values, while a power supply interface (IPowerSupply) provides methods for powering up and powering down, for example.

In addition, the framework provides the special category of the predetermined module-level interfaces, which can be used to communicate with the modules. These are the interfaces used by framework classes (i.e., "standard" implementations of framework interfaces) to communicate with vendor modules.

However, the use of the second aspect, the module-level interfaces, is optional. The advantage of doing so is that vendors may then take advantage of the implementations of classes such as ITesterPin and IpowerSupply, etc. while focusing on the content of specific messages sent to their hardware by implementing the module-level interfaces. If these interfaces are inappropriate to the vendor, however, they may choose to provide their custom implementations of the framework interfaces (e.g., vendor implementations of ITesterPin, IPowerSupply, etc.). The vendors would then provide the custom functionality that is appropriate for their hardware.

Now, split loading on a test plan program in the test equipment 100 with the abovementioned configuration.

Figure 6:
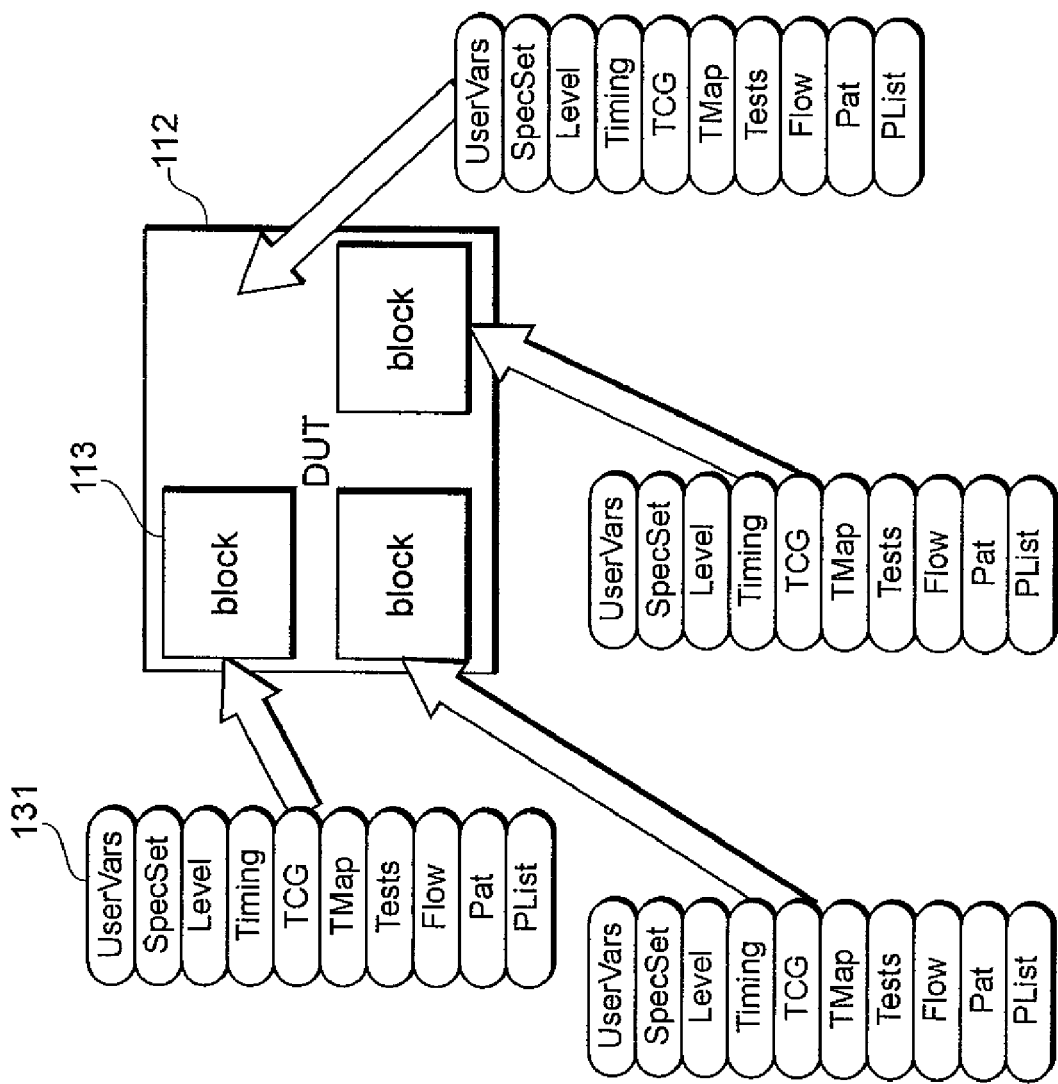
FIG. 6 is a schematic diagram showing an example of dividing (modularizing) of a test plan program.
Figure 11:
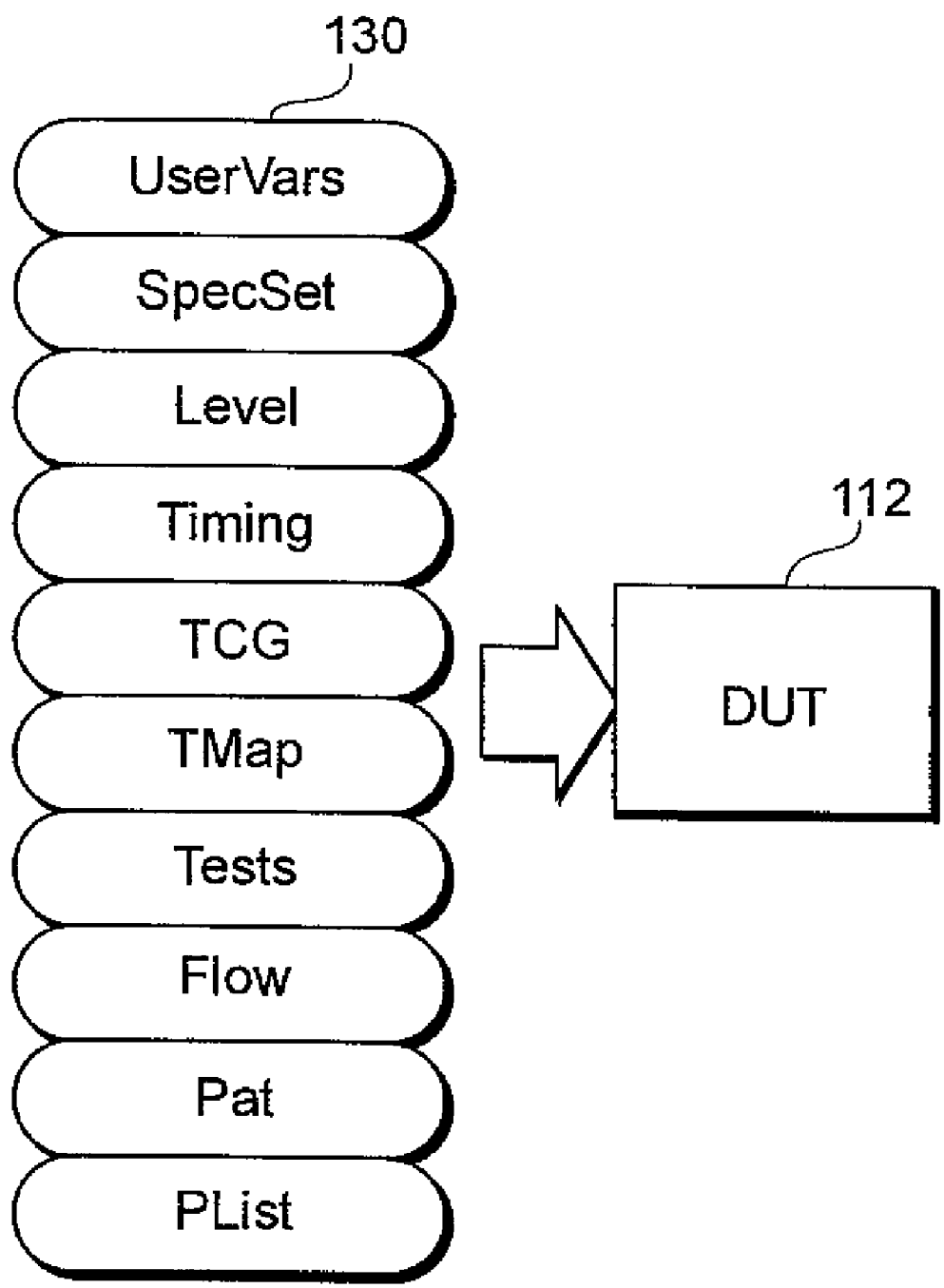
FIG. 11 is a schematic diagram showing an example of a conventional test plan program.

FIG. 6 is an outlined diagram showing an example of splitting (modularizing) of a test plan program. As for the conventional test plan programs, a test plan program 130 is defined to a DUT 112 as shown in FIG. 11. In the embodiment, however, users of the test equipment 100 can split the test plan programs for each two of smaller functional units based on the test scenarios as shown in FIG. 6. The test plan programs may be split by any kind of unit. For example, the test plan programs may be split for each block (component) 113, which forms a DUT 112, so that at least a sub-test plan program 131 is defined corresponding to each block 113. The test plan programs may be split according to the data type of the test plan or according to whether they are digital or analog.

Splitting of the test plan has two big advantages. First, splitting the test plan for each block 113 enables flexible development of the test plan program. Second, eliminating redundancy, i.e., overlaps or excesses, which are caused by loading of a pattern file and the like shortens a time for loading a test plan program.

First, the former advantage of making the test plan program development flexible will be described. Recently, as DUTs 112 has become bigger and more complex to be more functional, it has been more difficult for a development team to create a test plan for the entire of the DUT 112 with understanding of all the functions and configurations of the DUT 112. The functions of the blocks 113 of DUT 112 would be very different, and this difference might be as big as the difference between digital devices and analog devices. If the test equipment is adapted to be able to define a sub-test plan program for each block 113, which forms the DUT 112, by splitting the test plan program as in the embodiment, multiple teams may work on sub-test plan program 131 creation for the different parts (blocks) of the DUT 112. That may improve development efficiency.

Next, the latter advantage of shortening a time for loading a test plan will be described. Conventional test plans may have some test data in common as the test data for different types of products (DUT 112). Since conventional test equipment defines a test plan 130 for a DUT 112, if the product (DUT 112) to be tested is exchanged with another product of different model, the test plan also needs to be totally reloaded. As mentioned above, the DUTs 112 have been more complex these days. As the DUTs 112 have been more complex, the test plan programs have been bigger, requiring more pattern programs to use. That makes a time for loading a test plan unnecessarily longer, thus making a turn around time (TAT) in exchanging products unnecessarily bigger. If a test plan 130 is defined to a DUT 112 as in conventional manners, productivity on manufacturing line will lower as the DUT 112 is getting more complex. An actual test plan loading time is about 40 minutes today. The increase of device complexity will certainly increase this test plan loading time. If the test plan loading takes two hours in average and the user needs to exchange their product three times a day according to a manufacturing schedule, they will spend six hours a day only for test plan loading.

The embodiment has functions of splitting a test plan into sub-test plans 131 for reloading the sub-test plans 131 instead of loading the entire of the test plan each time required. With the functions, the test equipment 100 of the embodiment can skip many heavy processes such as pattern loading, pattern list loading, runtime objects creation, etc. related to execution of a test plan by loading only necessary sub-test plans in loading the test plan. As a result, the total time of loading a test plan may be shortened. That may improve the productivity.

When a test plan is split into ten sub-test plans and nine out of ten of the sub-test plans need to be reloaded, it might be slower to reload nine of them than the fresh loading of all sub-test plans. Thus, splitting a test plan into sub-test plans does not necessary shorten a loading time. It should be noted that loading methods should be selected flexibly according to the structure of the DUT 112 and the type of the test.

The system controller 102 needs to skip all the unnecessary steps to shorten a time of loading a test plan. For that purpose, the system controller 102 needs to identify what can be skipped and what cannot be skipped. Basically, when the products are exchanged, only needed is to separate the common part from the particular product specific part, specify only the particular product specific part and load or reload that part.

Figures 7, 8:
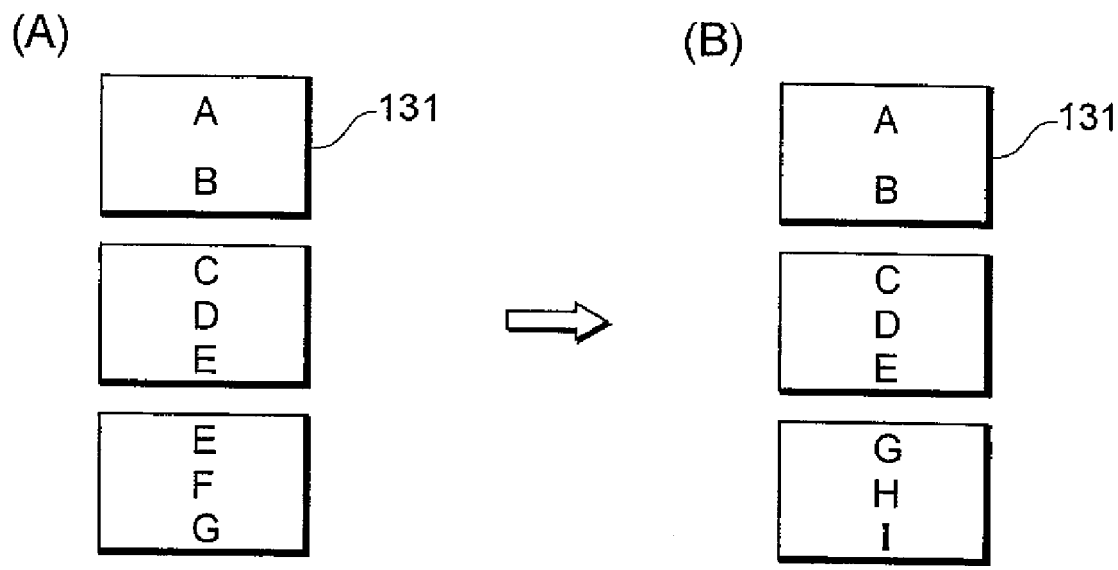
FIG. 8 is a diagram showing an example of a reference counter for managing a pattern to be reloaded.

FIG. 7 and FIG. 8 are diagrams for showing examples of splitting and loading of test plan programs. FIG. 7A is a diagram showing an example of sub-test plans 131 loaded to the test equipment 100 before exchanging the products. FIG. 7B is a diagram showing an example of sub-test plans 131 loaded to the test equipment 100 for exchanging the products. FIG. 3 is a diagram showing an example of a reference counter for managing patterns to be reloaded.

As shown in FIG. 7A, the embodiment shows a case where three sub-test plans 131 are loaded before exchanging the products. In the example, three sub-test plans 131 of a sub-test plan for testing patterns A and B, a sub-test plan for testing patterns C, D and E, and a sub-test plan for testing patterns E, F and G are loaded. It is assumed that the three sub-test plans 131 shown in FIG. 7B need to be loaded after exchanging the products. Specifically, the test plan consisting of the sub-test plan for testing the patterns A and B, the sub-test plan for testing the patterns C, D and E, and the sub-test plan for testing the patterns G, H and I is to be loaded.

Here, the system controller 102 of the test equipment 100 compares the test plans before and after exchanging the products, unloads the sub-test plan to be unneeded, and reloads a sub-test plan to be needed anew. The sub-test plans used both before and after exchanging the products are kept as loaded. In the example, since the sub-test plan for testing patterns E, F and G is unneeded after exchanging the products, it is unloaded. Since the sub-test plan for testing the patterns G, H and I is needed anew after exchanging the products, it is reloaded. Since the sub-test plan for testing the patterns A and B and the sub-test plan for testing the patterns C, D and E are also used after exchanging the products, the system controller 102 keeps them loaded instead of unloading them.

In addition, the system controller 102 compares patterns needed before and after exchanging the products, unloads patterns to be unneeded and reloads patterns to be needed anew, also for pattern files used in the test. The patterns used in common before and after exchanging the products are kept as loaded. Here, although any methods may be used for managing patterns, the patterns to be used preferably managed by using a reference counter as shown in FIG. 8. In the embodiment, as the pattern F is unneeded after exchanging the products, it is unloaded. The patterns H and I are needed anew after exchanging the products, they are reloaded. The patterns A, B, C, D, E and G are also used after exchanging the products, the system controller 102 keeps them loaded instead of unloading them. As the sub-test plan for testing the patterns E, F and G is unloaded but still the sub-test plan for testing the patterns C, D and E is left, it should be noticed that the pattern E is not unloaded. As the sub-test plan for testing the patterns E, F and G is unloaded but the sub-test plan for testing the patterns G, H and I is reloaded anew, it should be noticed that the pattern G is not unloaded.

Now, how sub-test plan programs 131 are configured when the test plan program is split will be described.

Figure 9:
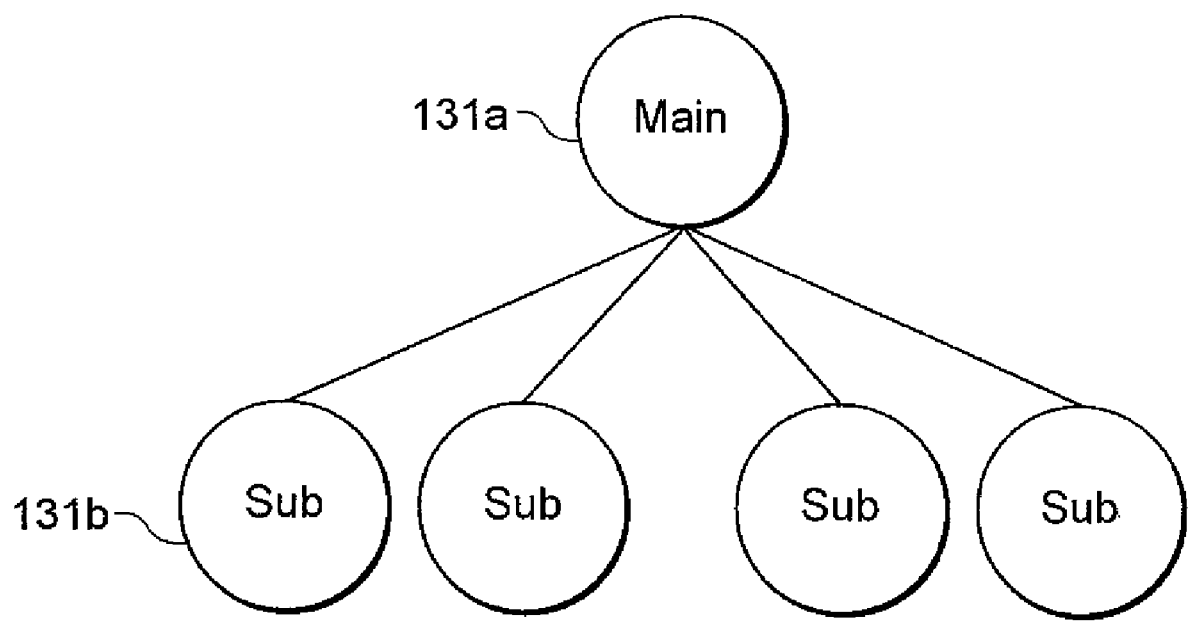
FIG. 9 is a diagram showing an example of a structure formed by a plurality of sub-test plan programs 131.

FIG. 9 is a diagram showing an example of a structure formed by a plurality of sub-test plan programs 131 in the embodiment. As shown in FIG. 9, one of the sub-test plan programs 131 may be determined as a main test plan program 131*a* and the others may be determined as general sub-test plan programs 131*b* in a specific set of test plan program. In the embodiment, when a test plan program is split, nesting among the split sub-test plans is not allowed and these sub-test plans are preferably in the relationship which can be described as a tree with all nodes (sub-test plan program 131*b*) connected to a single root (main test program 131*a*).

Here, all symbols visible from the sub-test plan program 131*b* are the symbols declared in that sub-test plan program 131*b* itself and ones declared in the main test plan program 131*a*. In the embodiment, the sub-test plan program 131*b* is not allowed to reference the symbols in the main test plan program 131*a* implicitly. This reference across test plan programs can be realized only explicitly, and with the scope resolver specification. Assuming the main test plan program 131*a* named as Main.tpl and a symbol OBJ inside this Main.tpl, this symbol can be referenced from any sub-test plan programs 131*b* in the form of 'Main::OBJ'.

A symbol SUBOBJ in a sub-test plan program Sub1.tpl cannot be referenced from any other sub-test plan programs 131*b* except the case where the sub-test plan programs 131*b* have a 'Final' attribute shown as below.

Figure 10:
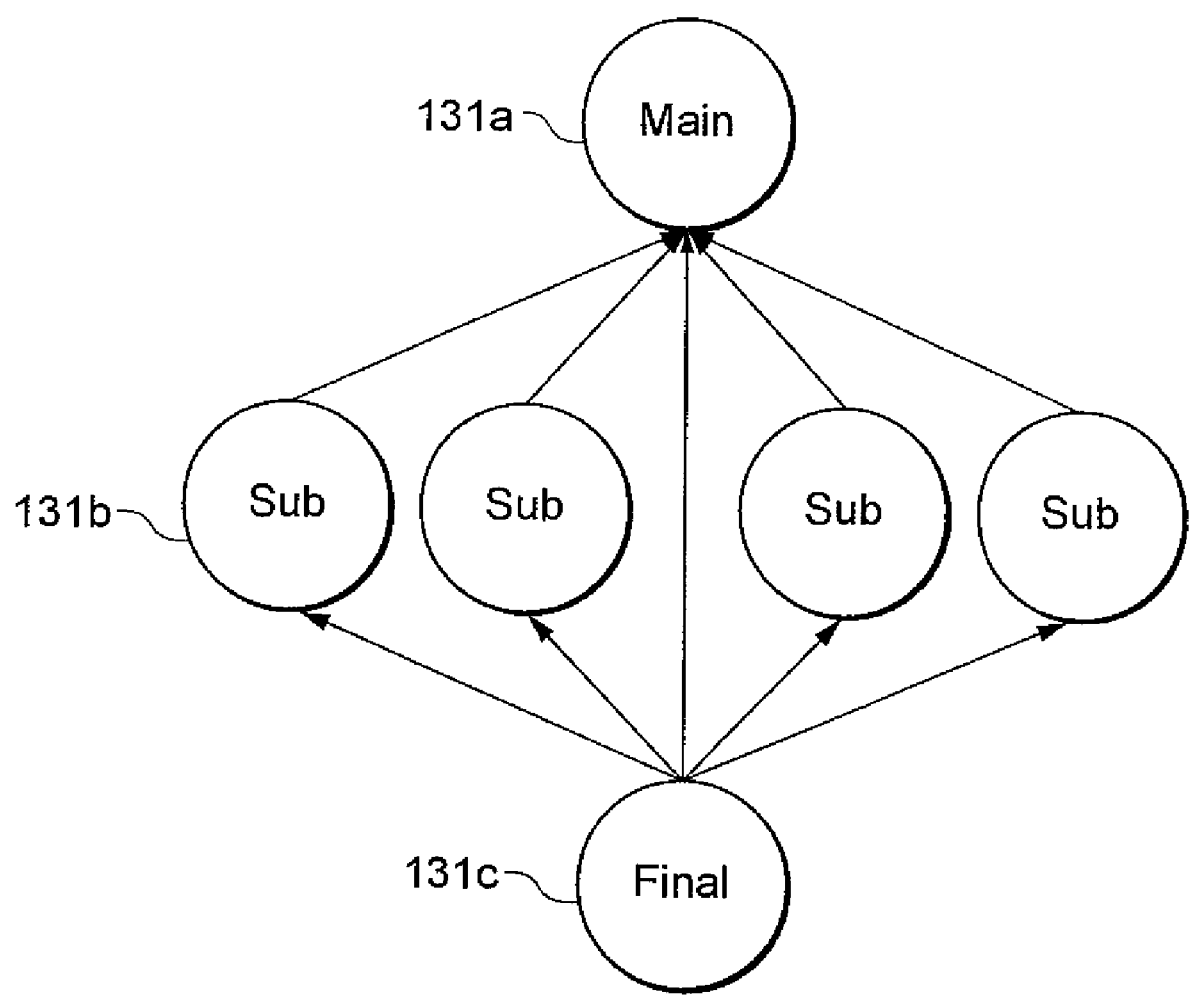
FIG. 10 is a diagram showing another example of a structure formed by a plurality of sub-test plan programs 131.

FIG. 10 is a diagram showing another example of a structure formed by a plurality of sub-test plan programs 131. As shown in FIG. 10, one of the sub-test plan programs 131 may be determined as a main test plan program 131*a*, the other one or more may be determined as a final test plan program 131*c*, and the others may be determined as general sub-test plan programs 131*b*. The sub-test plan program 131*c* specified as 'final' attribute can reference all the symbols in any sub-test plan programs (here, the main test plan program 131*a* or the sub-test plan program 131*b*) if only the symbols have been loaded. That is, external reference is allowed only for the final test plan 131*c* in particular. Thus, when the models of the DUTs 112 are exchanged, the final test plan 131*c* is unloaded.

To be described in details below, when a test plan is split into sub-test plans 131, symbols and variables among the sub-test program 131 can be referenced without requiring global variables to be used if the sub-test plan programs 131 are defined in a structure as shown in FIG. 9 and FIG. 10.

(Test Plan Specific Scope)

All data declared in the sub-test plan 131 should belong to a name space specific to the sub-test plan 131. The data itself should be accessible (or referable) from other sub-test plans 131. This logically means that data X declared in a sub-test plan TP1 must be referenced as 'TP1::X' from other sub-test plan programs. If this data X is referred from the sub-test plan 131 which declares X, it can be referenced as X from the sub-test plan 131. As reference of data is limited to the main test plan 131*a* or the sub-test plan 131*b*, the troubles happen in integrating the test plans 131, i.e. loading sub-test plan programs 131 onto the system controller 102 can be avoided. This rule can be applied even for resolutions on variables.

(Test Plan Specific Environment Variables)

Each sub-test plan 131 would use its own set of Pattern-Lists, Patterns, Test classes, etc, which are searched from the locations specified with the test equipment 100 environment variables. Each sub-test plan 131 would have the different location to search these data, so that each sub-test plan 131 would need to have own environment variables. The system controller 102 must maintain a set of environment variables per sub-test plan 131. This is necessary not only in the system controller 102 but also in the site controllers 104. It should be noted that when they are specified by patterns (combinations of patterns and timing), TimingMap is searched from the site controllers and loaded in a test plan loading time.

In the embodiment, all files that the system controller 102 loads are managed with its location such as by full path. Preferably, all pieces of data are named uniquely. The system controller 102 reports an error when it detects data with the name same as that of existing data and the existing data is loaded from the location different from the location where the new data is loaded from. This indicates some error to users, such as data version mismatching. If the location is the same, that will cause no problem.

It is assumed that a sub-test plan 131 uses the pattern A from the location A. If another sub-test plan B tries to use the pattern A, the system tries to load a file from the location where the system could search the file. What the requirement above is saying is that if this location is the location A, the system does not detect an error, and if the location is different from the location A, the system detects an error.

The way to handle environment variables is defined as below. If a sub-test plan program 131 specific environment variable is defined, the value stored in the variable can be changed. If it is not defined, the value specified by the main-test plan or the system default value is used. That enables users to change patterns, pattern lists and/or test classes by changing the location for loading.

(Applicable Restrictions)

In the embodiment, some restrictions can be applied to simplify the design.

First, the valid socket and pin description file is specified only by the main test plan program so that the system partition can be determined at the main test plan program 131a loading. Here, all the sub-test plan programs 131b must use the same socket file and pin description. If the sub-test plan program 131b uses the different socket files and pin descriptions, the system controller 102 may flag an error.

Second, data must exist before it is referenced. At any references to non-existing data, the system controller 102 flags an error.

Third, any data in all the sub-test plan programs 131 must be named uniquely. There can be only one name space for all the test plan programs 131.

Fourth, no need to have a function of overwriting data in sub-test plan programs 131 so that any data declaration with the same name in the same scope can be flagged as errors. If the overwriting function is included, any additional keyword or a predetermined syntax can be added.

Fifth, the system has an explicit validation phase for the data readiness. In the embodiment, these restrictions can be applied, but the system controller 102 does not stop as much as possible even if an error is flagged. Preferably, the system controller 102 continues processes as long as possible and report errors as many as possible so that users can fix many problems during single turn around.

(Loading Method of Split Test Plan)

In the embodiment, the test plan loading process is split into multiple phases because the test plan program is split. The test equipment 100 has multiple different commands in order to load a series of test plan programs. They are realized by system controller methods.

The test equipment 100 unloads all the loaded test plans first, and then loads the specified test plan by 'loadTestPlan (.tpl file, .env file)'..env file is optional. Desirably, .tpl file and .env file is specified with the absolute path.

Next, the test equipment 100 parses the sub-test plan loading description file (..stpl file), and then loads all listed files by 'loadSubTestPlans (..stpl file)'. The test equipment 100 keeps its contents to compare with test plans to be loaded anew in exchanging of devices or the like. Desirably, ..stpl file is specified with the absolute path.

Test Control Panel tool supports the three cases below for users to initiate test plan loading. The first case is that taking a .tpl file only. Not all users use split loading on the test plan, but conventional collective loading if they want to do so. Such users only want to specify .tpl. The next case is that taking a pair of a .tpl file and a ..stpl file. This case is for users to use the conventional collective loading and split loading according to the embodiment interactively. The final case is that taking a ..stpl file only. This is for reloading sub-test plan programs interactively. Users can use this functionality with specifying a different ..stpl file which has a different set of sub-test plan programs.

The ..stpl file needs to contain pairs of a .tpl file and an .env file, and specification of a special sub-test plan program that is used to establish the linkage of data components loaded from the main test plan program 131a and the sub-test plan programs 131b. This special sub-test plan typically has a flow definition in it. In the example of ..stpl file shown in Table 1, the keyword 'Final' is used to specify the special sub-test plan. The keyword is not limited to 'Final' and may be set for any word.

TABLE 1

Version 1.0;
SubTestPlans
{
    sub1.tpl sub1.env;
    sub2.tpl sub2.env;
    sub3.tpl sub3.env;
    Final flow.tpl flow.env;
}

The ..stpl file to define a set of sub-test plan programs has such functions of comments writing by a user and path specification to a .tpl file and a .env file (environment variable file). The path to be specified may be either the absolute path or the relative path. The relative path is preferably relative from ..stpl file location. The .env file specification is optional. If the .env file is not specified, the .env file specified with the main test plan program 131a is inherited.

As described earlier, when loadSubTestPlans ( ) method is called on the system controller 102, the system controller 102 compares the currently used ..stpl file and the specified ..stpl file, and figures out which sub-test plans need to be unloaded. The test plan specified with 'Final' is always unloaded. The system controller 102 recognizes which sub-test plans need to be loaded based on the comparison. The system controller 102 loads them and also loads the final test plan 131c. The system controller 102 may forcibly regards the sub-test plan listed at end of the ..stpl file as the final test plan 131c.

(Reference Management and Unloading)

After all the test plan programs 131 are loaded, references are established among the runtime objects and among many other pieces of data. These references may be established to data defined in the other sub-test plan programs 131. The embodiment supports a function of unloading the sub-test plans 131. The runtime objects and data associated with the unloaded sub-test plans are deleted when the sub-test plans 131 are unloaded, but the object/data references from the sub-test plan which is not unloaded needs to be maintained.

The system controller 102 manages the referencing between the runtime objects and the data.

This reference management is used to protect the test equipment 100. It is assumed that there are test plans A and B loaded on the system controller 102. The test plan A creates a TestCondition instance, and a test instance in the test plan B uses the TestConditon. The system may not unload the test plan A, because the TestCondition belonging to the test plan A is still used by the test plan B that is not unloaded. The system controller 102 preferably reports an error when the sub-test plan referenced from the other sub-test plan (in this example, the test plan A) is to be unloaded. The sub-test plan is not allowed to be unloaded if that may result in breaking any existing reference.

In the embodiment, since the final test plans 131*c* are defined as not to be referenced from the other sub-test plans (main test plan 131*a* or sub-test plans 131*b*), they are unloaded. If reference only needs to be between the main test plan program 131*a* and the sub-test plan program 131*b*, the abovementioned reference management needs not to be performed.

(API Requirement to Access Management Data)

In the embodiment, the system controller 102 manages which pattern lists, patterns, test class DLLs are used in each sub-test plan program 131. These pieces of data are preferably managed with certain attributes (e.g., absolute path from which the data is picked up). The test equipment 100 provides an API for a user to access the management data.

(Flow of Split Loading)

Now, an example of loading of a test plan in the embodiment, i.e., loading of split sub-test plans will be described.

First, a user specifies a set of the .tpl file and the .env file and the ..stpl file on the test control panel (TCP) of the test equipment 100. The test control panel executes loadTestPlan(.tpl, .env) method to load the main test plan program 131*a* onto the system controller 102. Then, the system controller 102 reads the .env file (environment variable), parses the .tpl file (main test plan), and generates the intermediate internal test plan program data in the system controller 102. All the loaded test plan programs and all the data (PatternList/Patterns/TCM/etc) are unloaded. The socket is read from the main test plan 131*a*, and the system controller 102 is partitioned.

SysCFlowable is executed in order to get a set of PatternLists for the main test plan 131*a*. All the specified PatternLists and associated patterns are loaded. The system controller 102 obtains all the test class DLL names from the main test plan 131*a*, and loads DLLs onto the site controllers 104. The intermediate main test plan program data is transferred to the site controller 104, and the runtime objects are created. TimingMaps are loaded if necessary.

The test control panel executes loadSubTestPlans(..stpl) method and loads the sub-test plans. First, the system controller 102 parses ..stpl file. Then, the system controller 102 compares ..stpl file contents which have been used and those to be used anew, and obtains sub-test plans to unload and test plans to load.

The system controller 102 loads the sub-test plans specified to load. All the associated data is loaded or created. After data readiness verification is done and the system is ready to execute the test plan, the user executes InitFlow for initialization and then executes MainFlow for performing a test.

Now, when DUT 112 is exchanged, it is assumed that the user replaces a file that has been used by a different ..stpl file by operating a test control panel to cause it to execute the loadSubTestPlans (..stpl file) method on the system controller 102 change.

Here, the system controller 102 parses ..stpl file. Then, the system controller 102 compares ..stpl file contents which have been used and those to be used anew, and obtains sub-test plans to unload and test plans to load. Then, system controller 102 initiates unloading of the test plans selected to unload. All the associated data will also be unloaded.

The system controller 102 loads the test plans selected to load. All the associated data is loaded or created. After data readiness verification is done and the system is ready to execute the test plan, the user executes InitFlow for initialization and then executes MainFlow for performing a test.

(Conclusion)

As mentioned above, in the embodiment, the test equipment 100 has functions below. First, the test equipment 100 has a specific method for loading the sub-test plan program 131. Also, the test equipment 100 has a method for unloading the specified sub-test plan program. The test plan is split when the main test plan program 131*a* is loaded. Preferably, all the pieces of data such as pattern lists, patterns, runtime objects, etc. are loaded on the site controller 104 each time the test plan program 131 is loaded. Also preferably, the hardware modules are loaded. In the embodiment, the main test plan program 131*a* is not removed even if the sub-test plan 131*b* is loaded. The sub-test plan program 131*b* is additional to the main test plan program 131*a*. The main test program 131*a* is removed by a specific method. Further, the system controller 102 has a proving mechanism for checking data reading.

The present invention is not limited to the abovementioned embodiments and various modifications are possible without departing from the spirit of the present invention. Thus, the embodiments are merely examples in various aspects and should not be construed as limited. For example, each of the above mentioned processing steps can be executed in different order or in parallel unless that contradicts with the processing.

What is claimed is:

1. Test equipment comprising:
   a memory to which a test plan consisting of a plurality of sub-test plans is loaded; and
   a system controller that loads the test plan to said memory by a unit of a sub-test plan and supplies a test signal to a device-under-test (DUT) by interpreting the loaded test plan,
   wherein said system controller detects a difference of test plans before and after changing of the DUTs of different models when the models of the DUTs are changed, and
   wherein said system controller exchanges the sub-test plans based on the detected difference.

2. The test equipment according to claim 1,
   wherein said system controller detects said difference based on a file that contains the plurality of sub-test plans included in the test plan.

3. The test equipment according to claim 1,
   wherein one of said plurality of sub-test plans is defined as a main test plan to enable the other sub-test plans to reference the data defined in said main test plan.

4. The test equipment according to claim 1,
   wherein one or more of said plurality of sub-test plans are defined as a final test plan to enable said final test plan to reference the data defined in the other sub-test plans.

5. The test equipment according to claim 4, wherein said system controller unloads said final test plan when the models of the DUTs are changed.

6. Test equipment comprising:
   a memory to which a test plan consisting of a plurality of sub-test plans is loaded; and a system controller that loads the test plan to said memory by a unit of a sub-test plan and supplies a test signal to a device-under-test (DUT) by interpreting the loaded test plan, wherein said system controller detects a difference between pattern files used for test plans before and after changing of the DUTs of different models when the models of the DUTs are changed, and wherein said system controller exchanges the patterns files based on the detected difference.

7. The test equipment according to claim 6, wherein said system controller manages the pattern files used for said test plan by using a reference counter.

8. A method for loading a test plan in test equipment that supplies a test signal to a device-under-test (DUT) comprising:

defining a test plan by dividing the test plan into a plurality of sub-test plans;

loading the test plan to a memory by a unit of a sub-test plan; and supplying the test signal to the DUT by interpreting the loaded test plan, wherein at said loading step, a system controller detects a difference of test plans before and after changing of the DUTs of different models when the models of the DUTs are changed, and wherein said system controller exchanges the sub-test plans based on the detected difference.

9. The loading method according to claim 8, wherein said system controller detects said difference based on a file that contains the plurality of sub-test plans included in the test plan.

10. The loading method according to claim 8, the method further comprising:

defining one or more of said plurality of sub-test plans are defined as a final test plan; and unloading said final test plan when the models of the DUTs are changed.

11. A method for loading a test plan in test equipment that supplies a test signal to a device-under-test (DUT) comprising:

defining a test plan by dividing the test plan into a plurality of sub-test plans;

loading the test plan to a memory by a unit of a sub-test plan; and supplying the test signal to the DUT by interpreting the loaded test plan, wherein at said loading step, a system controller detects a difference between pattern files used for test plans before and after changing of the DUTs of different models when the models of the DUTs are changed, and wherein said system controller exchanges the pattern files based on the detected difference.

12. The loading method according to claim 11, wherein said system controller manages the pattern files used for said test plan by using a reference counter.

13. A non-transitory computer readable medium storing a program product that causes a computer that forms test equipment to perform, when the test equipment actually tests a device-under-test (DUT), steps comprising:

defining a test plan by dividing the test plan into a plurality of sub-test plans;

loading the test plan to a memory by a unit of a sub-test plan; and supplying a test signal to the DUT by interpreting the loaded test plan, wherein at said loading step, said test equipment detects a difference of test plans before and after changing of the DUTs of different models when the models of the DUTs are changed, and wherein said test equipment exchanges the sub-test plans based on the detected difference.

14. A non-transitory computer readable medium storing a program product that causes a computer that forms test equipment to perform, when the test equipment actually tests a device-under-test (DUT), steps comprising:

defining a test plan by dividing the test plan into a plurality of sub-test plans;

loading the test plan to a memory by a unit of a sub-test plan; and supplying a test signal to the DUT by interpreting the loaded test plan, wherein at said loading step, said test equipment detects a difference between pattern files used for test plans before and after changing of the DUTs of different models when the models of the DUTs are changed, and wherein said test equipment exchanges the pattern files based on the detected difference.

* * * * *